United States Patent
Ishihara et al.

(10) Patent No.: US 10,916,497 B2
(45) Date of Patent: Feb. 9, 2021

(54) APPARATUSES AND METHODS FOR PROTECTING TRANSISTOR IN A MEMORY CIRCUIT

(71) Applicant: MICRON TECHNOLOGY, INC., Boise, ID (US)

(72) Inventors: Takashi Ishihara, Machida (JP); Wataru Nobehara, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/144,615

(22) Filed: Sep. 27, 2018

(65) Prior Publication Data
US 2020/0105661 A1   Apr. 2, 2020

(51) Int. Cl.
H01L 23/522   (2006.01)
H01L 27/02    (2006.01)
H01L 27/105   (2006.01)
H01L 23/00    (2006.01)

(52) U.S. Cl.
CPC .......... *H01L 23/5222* (2013.01); *H01L 24/09* (2013.01); *H01L 27/0266* (2013.01); *H01L 27/0292* (2013.01); *H01L 27/105* (2013.01); *H01L 2224/02331* (2013.01)

(58) Field of Classification Search
CPC ............. H01L 23/5222; H01L 27/0266; H01L 27/0292; H01L 27/105; H01L 24/09
See application file for complete search history.

(56) References Cited

U.S. PATENT DOCUMENTS

| | | | | |
|---|---|---|---|---|
| 8,836,146 B2* | 9/2014 | Chou | .................. | H01L 23/3157 257/780 |
| 2004/0227337 A1* | 11/2004 | Ruckdeschel | ....... | B60R 21/2644 280/736 |
| 2005/0023692 A1* | 2/2005 | Matsunaga | ........... | H01L 23/367 257/758 |
| 2005/0111153 A1* | 5/2005 | Kitagawa | ............ | H01L 27/0266 361/91.1 |
| 2005/0242838 A1* | 11/2005 | Song | ................ | H03K 19/00323 326/82 |
| 2009/0107443 A1* | 4/2009 | Sarbacker | ........... | F02N 11/0862 123/179.28 |
| 2013/0187221 A1* | 7/2013 | Lu | ..................... | H01L 21/26506 257/329 |
| 2016/0133704 A1* | 5/2016 | Karino | .................. | H01L 29/808 257/272 |
| 2018/0204831 A1* | 7/2018 | Seidemann | ............. | H01L 23/60 |
| 2019/0245543 A1* | 8/2019 | Lee | ......................... | H01L 27/11 |

* cited by examiner

*Primary Examiner* — Christine A Enad
(74) *Attorney, Agent, or Firm* — Dorsey & Whitney LLP (57) ABSTRACT

A semiconductor device may include a multi-level wiring structure comprising a first-level wiring layer, a second-level wiring layer and an insulating layer between the first-level wiring layer and the second-level wiring layer. The device may also include a bond pad, a first wiring extending from the bond pad, and a second wiring overlapping at least in part with the first wiring through the insulating layer to be capacitively coupled to the first wiring. The first wiring and the second wiring may each be formed respectively as the first-level wiring layer and the second-level wiring layer. The device may also include a protection circuit configured to be DC coupled to the second wiring. The first-level wiring layer may include a redistribution layer (RDL).

19 Claims, 7 Drawing Sheets

APPARATUSES AND METHODS FOR PROTECTING TRANSISTOR IN A MEMORY CIRCUIT

BACKGROUND

Stacked memories achieve higher memory density for both memory chips and memory modules, such as DRAM and NAND memories. Existing technologies include using the redistribution layers (RDL) as an upper metal layer to connect the pads of multiple stacked chips. However, the charge device model (CDM) may occur in the form of a parasitic capacitance between the RDL and a metal wiring. A metal wiring may be capacitively coupled to a RDL layer and also coupled to a transistor gate. When CDM becomes large, CDM noise may become large to cause a transistor gate insulating film may to break.

BRIEF DESCRIPTION OF THE DRAWINGS

The present solution will be described with reference to the following figures, in which like numerals represent like items throughout the figures.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1A:
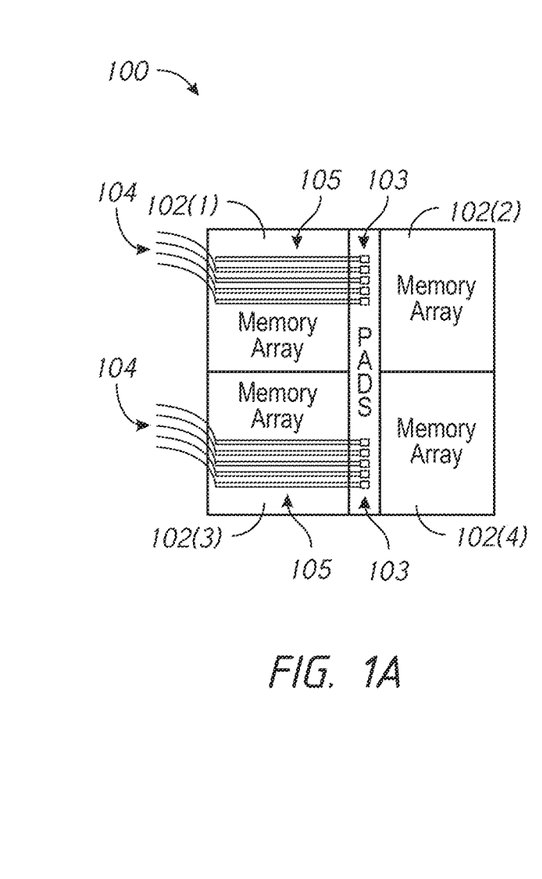
FIG. 1A illustrates a schematic block diagram of an example of one or more RDL layers in a memory device in accordance with some examples disclosed herein.

FIG. 1A illustrates a schematic block diagram of an example of one or more RDL layers in a memory device in accordance with some examples disclosed herein. In some examples, a semiconductor device, such as a stacked memory device 100 may include one or more memory arrays, such as 102(1), 102(2), 102(3), 102(4) or additional memory arrays (now shown). Memory device 100 may also include a RDL layer 105 disposed on the die as an upper metal layer to allow bonding of pins, e.g., 104, from different location of a chip, facilitating a simple chip-to-chip bonding. For example, RDL layer 105 may be configured to interconnect the central bond pads, e.g., 103, to the bond pads at the edge of the die to allow for multi-chip stacking. In a non-limiting example, pins 104 may be bonded to the central bond pads 103 via bonding to the bond pads at the edge of the memory device 100.

Figure 1B:
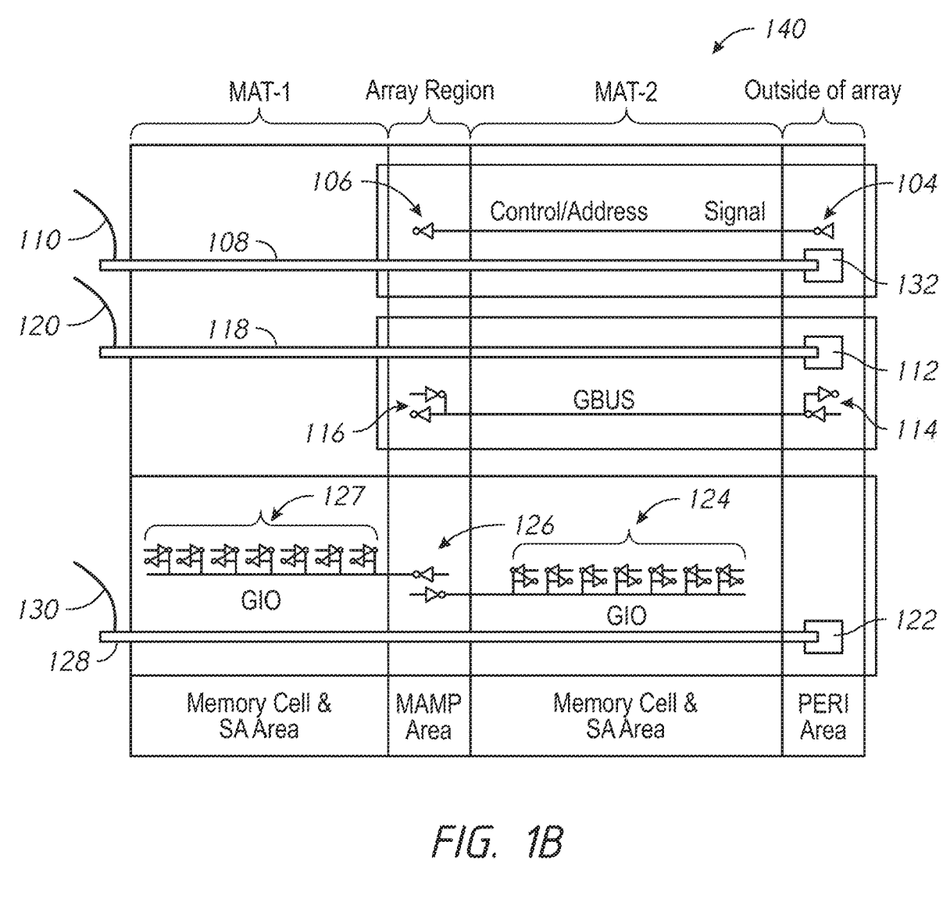
FIG. 1B illustrates various types of circuits under a RDL layer in a semiconductor device in accordance with some examples disclosed herein.

FIG. 1B illustrates various types of circuits under a RDL layer in a semiconductor device in accordance with some examples disclosed herein. In some examples, a RDL layer may be disposed across one or more memory array areas to outside of the memory array areas (e.g., a peripheral region). For example, RDL layer 108 connects between a bond pad (e.g., 132, 112, 122) in the peripheral region and a pin (e.g., 110, 120, 130) in a proximity of an edge of the semiconductor device by elongating over memory cell and sense-amplifier (SA) areas, such as MAT-1 and MAT-2. A MAT, such as MAT-1 and MAT-2, may include a flat and uniform region where only memory cells are arranged. Each of the memory cell and SA areas may include multiple memory cells. In some scenarios, a memory device may include various types of circuits underneath the RDL layer. For example, memory array 140 may include an array region in which one or more circuits, e.g., 106, 116, 126 are disposed. The array region 140 may include common circuitry configured to communicate with both adjacent MAT-1 and MAT-2 areas, such as decoder circuits, global I/O line drivers, access line drivers, sense amplifiers, array control circuitry, etc. In a non-limiting example, circuit 106 may include a decoder circuit and is coupled to a logic circuit 104 in the outside of array area via a control/address signal line. For example, the control/address signal line may be at least a portion of a top metal layer. In a non-limiting example, circuit 116 may include a main amplifier (MAMP) circuit and is coupled to a logic circuit 114 via a bus line. In a non-limiting example, circuit 126 may include a buffer circuit and is coupled to one or more bus lines 127, 124 in the MAT-1 and MAT-2.

Figure 2:
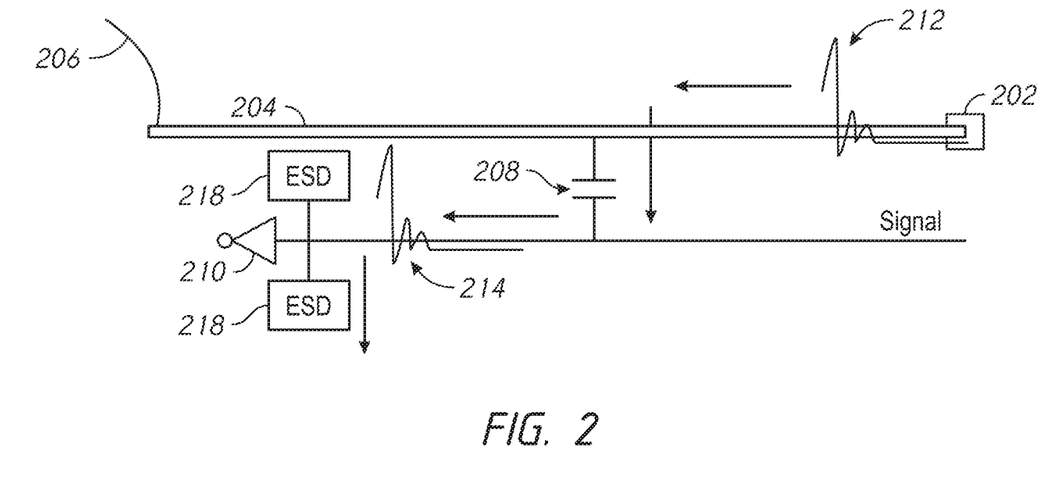
FIG. 2 illustrates a diagram of a protection circuit in a semiconductor device in accordance with some examples disclosed herein.

In some examples, systems and methods for protecting circuitry in various memory configurations are be provided. FIG. 2 illustrates a diagram of a protection circuit in a semiconductor device in accordance with some examples disclosed herein. In some examples, a capacitance 208 may be formed between a RDL layer 204 may and a top metal layer such as a signal line. The signal line may be coupled to a logic circuit, such as a buffer circuit 210. The capacitance 208 may allow a charge to be built and transmitted from the RDL layer to the buffer circuit 210. For example, a noise signal 212 may be accumulated on the RDL layer 204 and subsequently transmitted to the signal line through capacitance 208. As a result, a charge 214 may be formed on the input of the buffer circuit 210, which may damage the buffer circuit 210. For example, the buffer circuit 210 may include a transistor that includes a gate insulating film. Repetitive and/or high magnitude charges, such as the charge 214 may eventually cause a breakdown of the gate insulating film, which may affect operation of the transistor of the buffer circuit 210. In some scenarios, one or more protection circuits 218 may be coupled directly to the input of the buffer circuit 210 to discharge the charge 214 before it damages circuitry of the buffer circuit 210. In a non-limiting example, the protection circuit 218 may include an electrostatic discharge (ESD) circuit.

Figure 3A:
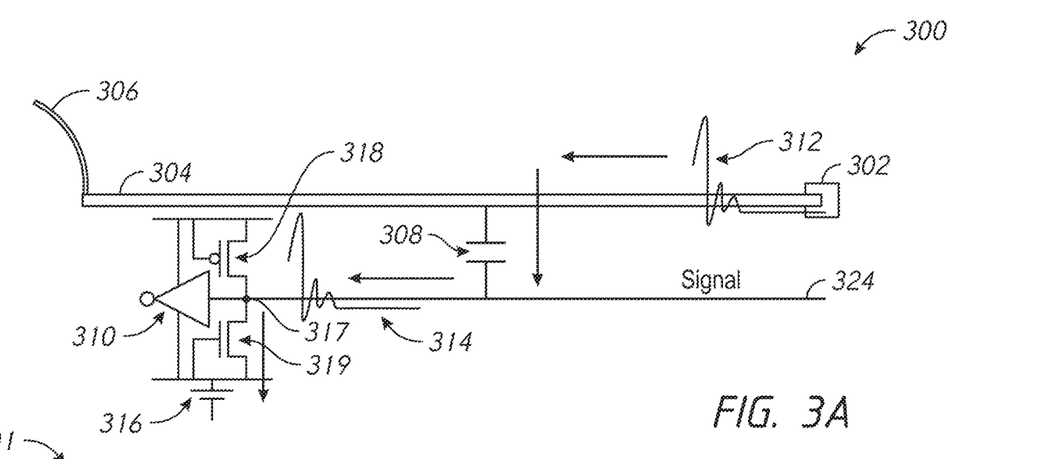
FIGS. 3A-3C illustrate diagrams of an example protection circuit in a semiconductor device in accordance with some examples disclosed herein.
Figure 3B:
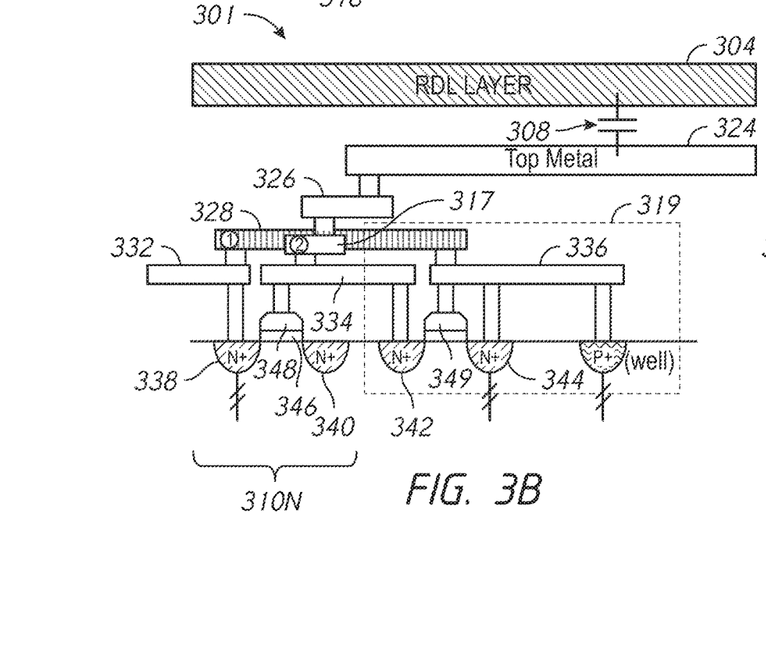
Figure 3C:
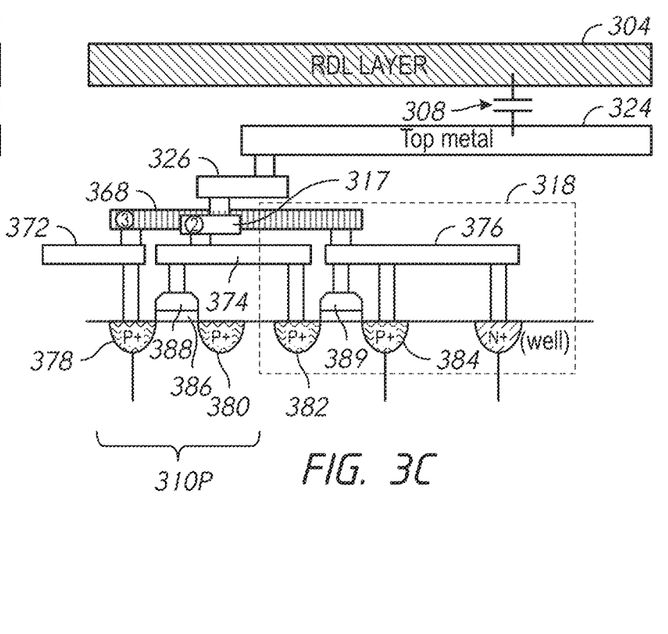

FIGS. 3A-3C illustrate diagrams of an example protection circuit in a semiconductor device in accordance with some examples disclosed herein. FIG. 3A is a schematic diagram 300 of an example protection circuit. FIGS. 3B and 3C each illustrate respective cross-sectional diagrams 301 and 320 of a portion of a protection circuit in a semiconductor device in accordance with some examples disclosed herein. Common references numbers are used to identify common elements between FIGS. 3A-3C. In some examples, capacitance 308 may be formed between a RDL layer 304 and a top metal layer such as a signal line 324. The signal line 324 may be coupled to a logic circuit, such as a buffer circuit 310. The capacitance 308 may allow a charge to be built and transmitted from the RDL layer to the buffer circuit 310. For example, a noise signal 312 may be accumulated on the RDL layer 304 and subsequently transmitted to the signal line through capacitance 308. As a result, a charge 314 may be formed on the input of the buffer circuit 310. In some scenarios, an ESD circuit 316 may be coupled directly to the input of the buffer circuit 310, such as the gate insulating film of a transistor to discharge the accumulated charge 314.

In some examples, ESD circuit 316 may include a P-type transistor and an N-type transistor, e.g., 318, 319. In a non-limiting example in FIG. 3A, transistors 318 and 319 may each have a gate that is respectively coupled to a power voltage and ground. Transistors 318 and 319 may be coupled to a common source/drain, which is also coupled to the input node (317) of the buffer circuit 310. In some examples, a buffer circuit, such as 310, includes an inverter. The inverter 310 may include a pair of P-type transistor (e.g., 310P of FIG. 3C) and N-type transistor (e.g., 310N of FIG. 3C) having a common gate coupled to the input node of the inverter, and a common source/drain coupled to the output node of the inverter. In such case, the common source/drain of the P-type transistor and N-type transistor 318, 319 of the ESD circuit 316 may be directly coupled to the common gate of the inverter 310. In operation, a charge 314 (positive or negative) transmitted from the RDL layer to the signal line may be discharged either through the source/drain of P-type transistor 318 (negative charge) or source/drain of N-type transistor 319 (positive charge). Details of the protection circuit are further described with reference to FIGS. 3B and 3C.

Turning to FIGS. 3B and 3C, in some examples, a semiconductor device may include a multi-level wiring structure comprising a first-level wiring layer 304 and a second-level wiring layer 324. The second-level wiring layer 324 may be overlapping with the first-level wiring layer 304, at least in part. For example, the second-level wiring layer 324 may be disposed below the first-level wiring layer 304. For example, the first-level wiring layer 304 may include a RDL layer, and the second-level wiring layer 324 may include a top metal layer. An insulating layer may be disposed between the first-level wiring layer 304 and the second-level wiring layer 324. Semiconductor device may include one or more bonding pads (not shown) configured to communicate with an outside of the device. In some examples, the RDL layer 304 may be coupled to the one or more bonding pads and configured to extend from the bonding pads to another area of the semiconductor. For example, the RDL layer 304 may extend a central bond pad to a proximity of an edge of the semiconductor device (see FIG. 1). Alternatively, the RDL layer 304 may extend an edge bond pad of the semiconductor device to a central peripheral area of the semiconductor, or extend from a bond pad in a first edge area to a second edge area of the semiconductor device.

With further reference to FIG. 3B, the first RDL layer 304 and the top metal layer 324 may be capacitively coupled. For example, capacitance 308 is formed between the RDL layer 304 and top metal layer 324. Semiconductor device 300 may further include a protection element, e.g., protection circuit 319, that is configured to DC coupled (e.g., by direct current) to the top metal layer 324. Protection circuit 319 may be coupled to top metal layer 324 via conductive layers 334, 317, 326. In some examples, protection circuit 319 may include an N-type transistor. In such case, circuit 319 may include one or more N-type doping 342, 344 in a P-substrate to form source/drain of the N-type transistor. Protection circuit 319 may also include a gate layer that forms the gate 349 of the N-type transistor. Gate 349 may be coupled to the ground via a conductive layer, such as 336.

With further reference to FIG. 3B, semiconductor device may also include a transistor, such as an N-type transistor 310N of the inverter 310. For example, N-type transistor 310N may include one or more N-type doping 338, 340 in the P-substrate to form source/drain of the N-type transistor of the inverter. Gate layer may also form gate 348 of the N-type transistor. In some scenarios, gate 348 may be coupled to the drain/source of the N-type transistor of the protection circuit 319 via a conductive layer such as 334. Semiconductor device 300 may also include a gate insulating layer 346 disposed between gate 348 and the substrate. The gate insulating layer may include a gate insulating film. Protection circuit 319 may thus be configured to discharge a charge accumulated at the RDL layer 304 and protect the gate insulating layer 346. For example, noise may be accumulated at RDL layer 304 and form a charge that travels through top metal layer 324 through conductive layers 326, 317, 334 to the drain/source 342 of the N-type transistor of circuit 319. The charge may further travel to the ground through source/drain 344 and conductive layer 336. As such, the charge caused by the noise on RDL layer 304 will bypass the gate 348 of the N-transistor 310N of the inverter 310 to facilitate protection of the underneath gate insulating layer 346.

Similar to FIG. 3B, the protection circuit 318 including a P-type transistor is illustrated in FIG. 3C. The semiconductor device may further include a protection element 318 that is configured to DC couple (e.g., by direct current) to the top metal layer 324. For example, circuit 318 may be coupled to top metal layer 324 via conductive layers 374, 317, 326. In some examples, protection circuit 318 may include a P-type transistor. In such case, protection circuit 318 may include one or more P-type doping 382, 384 in an N-substrate to form source/drain of the P-type transistor. Gate layer may also form the gate 389 of the P-type transistor. Gate 389 may be coupled to a power voltage via a conductive layer, such as 376.

With further reference to FIG. 3C, semiconductor device may also include a transistor, such as a P-type transistor 310P of the inverter 310. For example, P-type transistor may include one or more P-type doping 378, 380 in the N-substrate to form source/drain of the P-type transistor of the inverter. In semiconductor device, gate layer may form the gate 388 of the P-type transistor. In some scenarios, gate 388 may be coupled to the drain/source of the P-type transistor of the protection circuit 318 via a conductive layer such as 374. Semiconductor may also include a gate insulating layer 386 disposed between gate 388 and the substrate. Gate insulating layer may include a gate insulating film. Protection circuit 318 may thus be configured to discharge a charge accumulated at the RDL layer 304 and protect the gate insulating layer 386. For example, noise may be accumulated at RDL layer 304 and form a charge that travels through top metal layer 324 through conductive layers 326, 317, 374 to the drain/source 382 of the P-type transistor of circuit 318. The charge may further travel to the ground through source/drain 384 and conductive layer 376. As such, the charge caused by the noise on RDL layer 304 will bypass gate 388 of the P-transistor 310P of the inverter 310 to facilitate protection of the underneath gate insulating layer 386.

Figure 4:
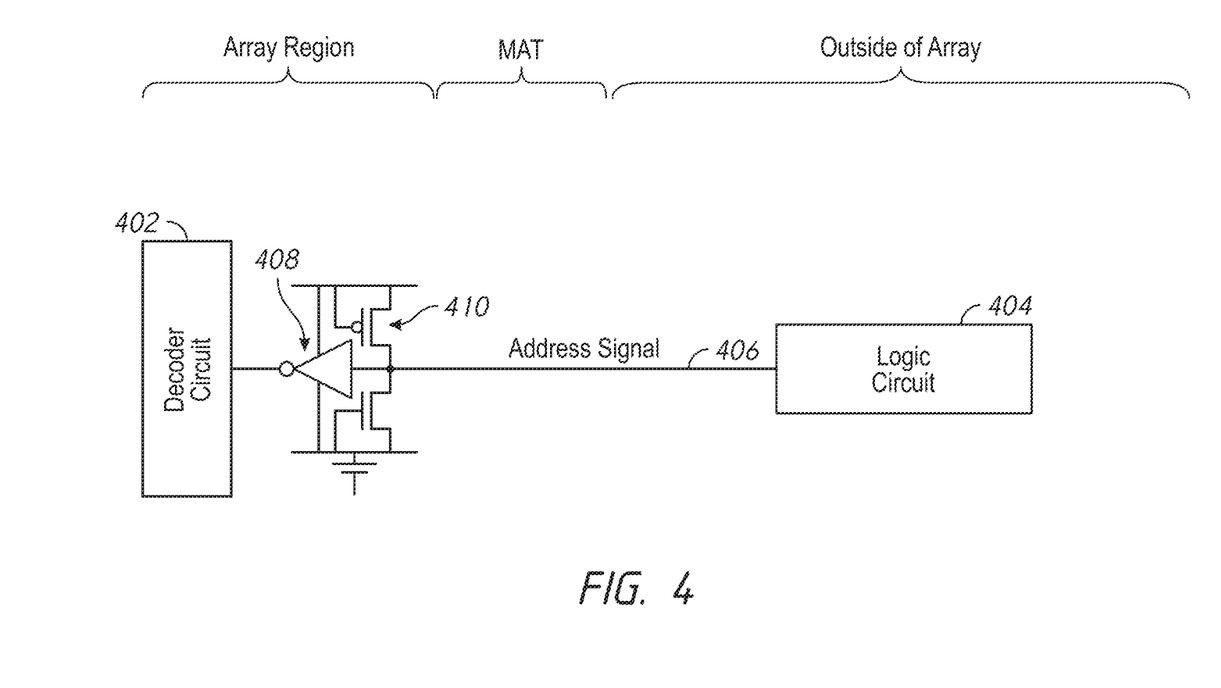
FIGS. 4-7 illustrate various examples of protection circuits in accordance with some examples disclosed herein.

Various configurations of semiconductor device depicted in FIGS. 3A-3C may be implemented and configured to protect various types of circuits, such as shown in FIG. 1B. For example, FIG. 4 illustrates an example protection circuit in accordance with some examples disclosed herein. Logic circuit 404 outside the MAT may be coupled to a circuit 402 in an array region via a signal line 406. Logic circuit 404 may be configured to generate a signal and transmit the signal through the signal line to the circuit 402 in the array region. For example, logic circuit 404 may include an address decoder configured to provide an address signal to circuit 402. The address signal line may include multiple bits, such as <7:0>. In a non-limiting example, circuit 402 may include a row or column decoder, and logic circuit 404 may include an address decoder configured to provide a row or column address signal to the column or row decoder 402. In other non-limiting examples, the signal line 406 between circuit 402 and circuit 404 may carry other types of signals, e.g., test signal, control signal for voltage generator, etc.

In some examples, a buffer circuit 408 may be coupled in serial between circuit 402 and circuit 404. For example, buffer circuit 408 may be disposed in the array region, in which circuit 402 is located also. Additionally, a protection circuit 410 may be coupled to the input node of the buffer circuit 408 and configured to protect the buffer circuit by discharging a charge caused by noise on the RDL layer (not shown). In some scenarios, the input of the buffer circuit may include a transistor gate. In such case, protection circuit 410 may be disposed in the array region in which the buffer circuit 408 is located. As shown in FIG. 4, protection circuit 410 may be disposed in a proximity of the buffer circuit 408, such as the gate of the buffer circuit, in a similar manner as the protection circuits 318 and 319 are coupled to the buffer circuit 310 of FIGS. 3A-3C.

Figure 5:
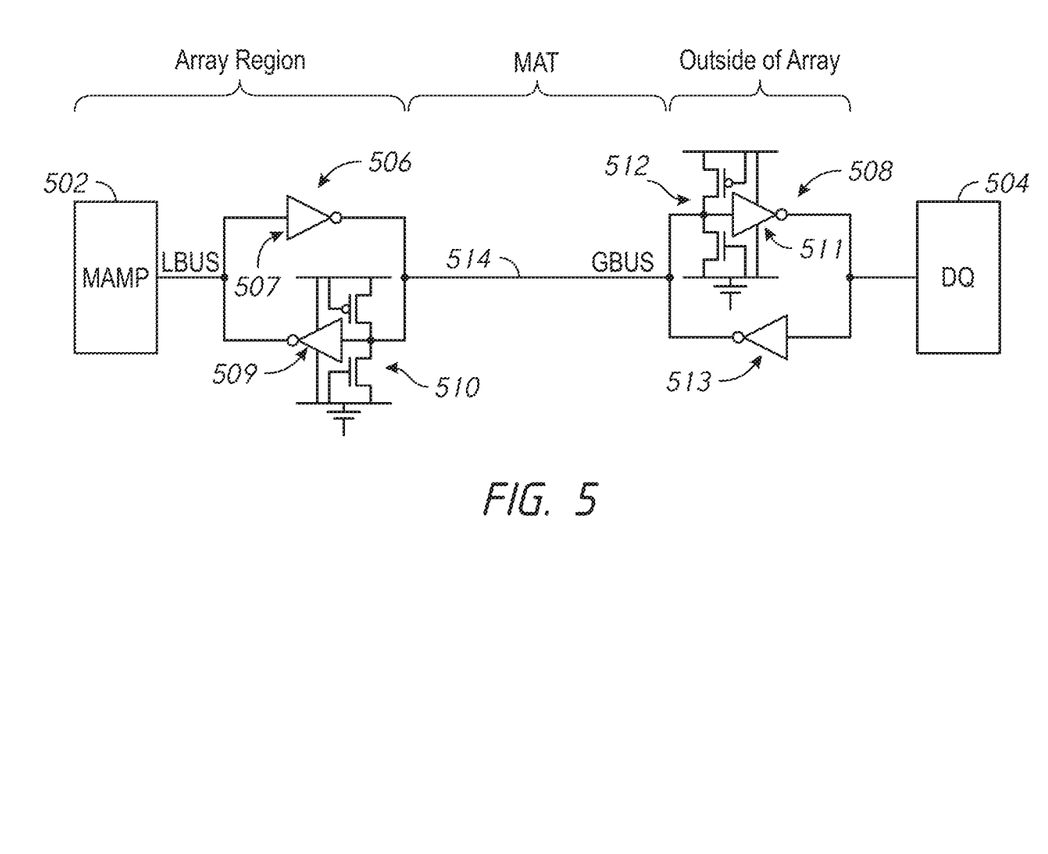

FIG. 5 illustrates an example protection circuit in accordance with some examples disclosed herein. Circuit 508 outside the MAT may be coupled to a circuit 510 in an array region via a signal line 514. The signal line 514 may be bi-directional. In other words, circuit 508 may be configured to generate a signal and transmit the signal through the signal line 514 to circuit 506. Circuit 506 may be configured to generate a signal and transmit the signal through the signal line 514 to circuit 508. Correspondingly, each of circuits 506, 508 may be configured to receive a signal from another circuit via the signal line 514. In some examples, circuits 506, 508 may include buffer circuits. For example, circuit 508 may include a bi-directional buffer that includes two inverters 511 and 513 disposed in opposite directions and coupled in parallel. In such configuration, one inverter, e.g., 513 may be a driver whereas the other, e.g., 511 may be a receiver. Circuit 508 may be coupled to a data DQ circuit 504 and configured to read/write data bits from/to the DQ circuit. In some examples, circuit 506 may also include a buffer circuit that includes two inverters 507, 509 disposed in opposite directions and coupled in parallel. Circuit 506 may be coupled to a main amplifier circuit 502, such as read/write amplifier that is coupled to the memory array to read/write data from/to the memory array. Buffer circuits 506 and 508 may be coupled via a global data bus line (GBUS), in some examples. Buffer circuit 506 may be coupled to a read/write amplifier 502 via a local data bus line (LBUS).

With further reference to FIG. 5, in some examples, a protection circuit may be coupled to each of the buffer circuits 506, 508. For example, a protection circuit 510 may be coupled to the buffer circuit 506. A protection circuit 512 may be coupled to the buffer circuit 508. In some examples, protection circuit 510 may be disposed in the array region in which the buffer circuit 506 resides and is coupled between the input of inverter 509 in the buffer circuit and the signal line 514. For example, protection circuit 510 may be disposed in a proximity of the buffer circuit 506, and is directly coupled to a portion of the buffer circuit, such as a transistor gate of an input of the inverter in a similar manner as the protection circuits 318 and 319 are coupled to the buffer circuit 310 of FIGS. 3A-3C. In some examples, protection circuit 512 may be disposed outside of MAT in which the buffer circuit 508 is located and is coupled between an input of inverter 511 in the buffer circuit and the signal line 514. For example, protection circuit 512 may be disposed in a proximity of the input of inverter 511, such as a transistor gate and is directly coupled thereto in a similar manner as the protection circuits 318 and 319 are coupled to the buffer circuit 310 of FIGS. 3A-3C.

Figure 6:
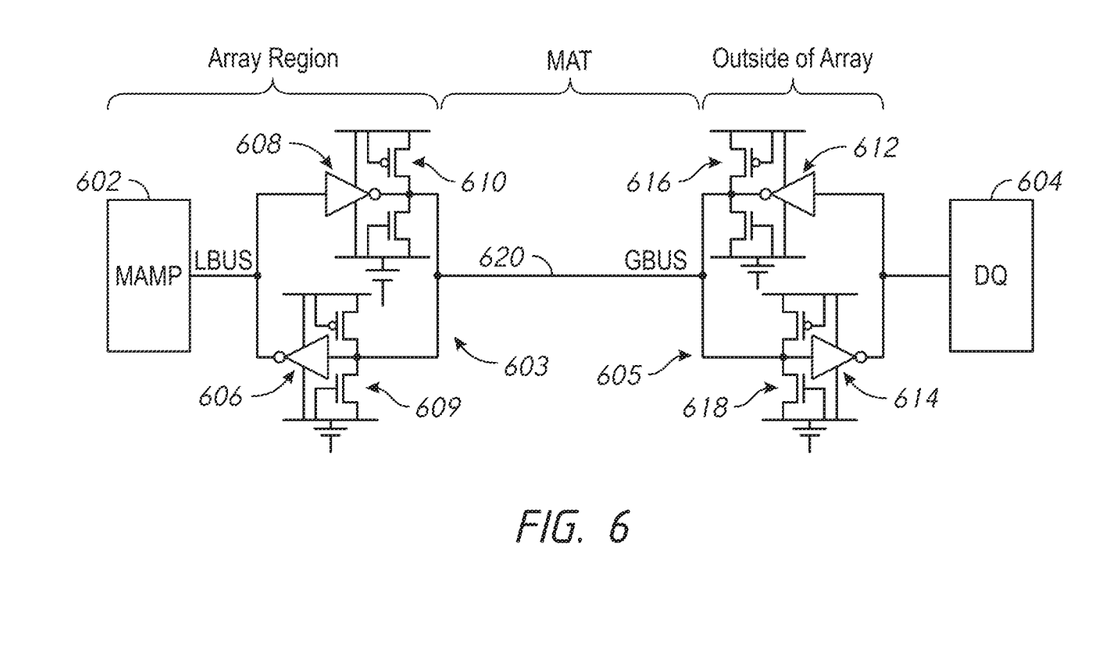

FIG. 6 illustrates an example protection circuit in accordance with some examples disclosed herein. In some examples, a circuit 603 may be placed outside the MAT and coupled to a circuit 605 placed in an array region via a signal line 620. The signal line 620 may be bi-directional. In other words, circuit 603 may be configured to generate a signal and transmit the signal through the signal line 620 to circuit 605. Circuit 605 may be configured to generate a signal and transmit the signal through the signal line 620 to circuit 603. Correspondingly, each of circuits 603, 605 may be configured to receive a signal from another circuit via the signal line 620. For example, circuit 603 may include a bi-directional buffer that includes two inverters 606, 608 disposed in opposite directions and coupled in parallel. Circuit 603 may be coupled to a main amplifier circuit 602, such as read/write amplifier that is coupled to the memory array to read/write data from/to the memory array. Circuit 605 may be coupled to a DQ circuit 604 and configured to read/write data bits from/to the DQ circuit. In some examples, circuit 605 may also include a bi-directional buffer that includes two inverters 612, 614 disposed in opposite directions and coupled in parallel. Buffer circuits 603 and 605 may be coupled via a global data bus line (GBUS). Buffer circuit 603 may be coupled to a read/write amplifier 602 via a local data bus line (LBUS).

With further reference to FIG. 6, in some examples, a protection circuit may be coupled to each inverter of the buffer circuits 603, 605. For example, a protection circuit 610 may be coupled to an output of inverter 608 (a driver) of the buffer circuit 603. An additional protection circuit 609 may also be coupled to an input of inverter 606 (a receiver) of the buffer circuit 603. Similarly, a protection circuit 616 may be coupled to an output of inverter 612 (driver) of the buffer circuit 605. An additional protection circuit 618 may also be coupled to an input of inverter 614 (receiver) of the buffer circuit 605. Protection circuits 609 and 610 may be disposed in the array region in which the buffer circuit 603 is located and each protection circuit 609, 610 may be coupled between an associated inverter in the buffer circuit and the signal line 620. For example, protection circuit 610 may be disposed in a proximity of the buffer circuit 603, such as the output of inverter 608 of the buffer circuit. In some scenarios, inverter 608 may include a pair of P-type transistor and N-type coupled together at a common source/drain and also having a common gate at the input. Whereas inverter 608 may have a common source/drain of the P-type and N-type transistors as the output, protection circuit 610 may be directly coupled to the common source/drain of the inverter. Coupling the protection circuit to the output of the circuit may protect contact plugs from being damaged due to the accumulated charge at the RDL line, where the contact plugs are arranged at the output of the circuit and connected to a diffusion layer. Similarly, inverter 606 may also include a pair of P-type transistor and N-type transistor coupled together at a common source/drain and also having a common gate at the input. Protection circuit 609 may be disposed in a proximity of the buffer circuit, and is also coupled to an input of inverter 606 in a similar manner as the protection circuits 318 and 319 are coupled to the buffer circuit 310 of FIGS. 3A-3C.

In some examples, protection circuits 616 and 618 may be disposed outside of the MAT, e.g., in a peripheral region, in which the buffer circuit 605 is located and each protection circuit may be coupled between an associated inverter in the buffer circuit and the signal line 620. For example, protection circuit 616 may be disposed in a proximity of the inverter 612, such as the output of inverter 612. In some scenarios, inverter 612 may include a pair of P-type transistor and N-type transistor coupled together at a common source/drain and also having a common gate at the input. Whereas inverter 612 may have a common source/drain of the P-type and N-type transistors as the output, protection circuit 616 may be directly coupled to the common source/drain of the inverter. Similar to protection circuit 610, protection circuit 616 may also be coupled to the output of the circuit and may protect contact plugs from being damaged due to the accumulated charge at the RDL line, where the contact plugs are arranged at the output of the circuit and connected to a diffusion layer. Similarly, inverter 614 may also include a pair of P-type transistor and N-type transistor coupled together at a common source/drain and also having a common gate at the input. Protection circuit 618 may be coupled to an input (e.g., a common gate) of inverter 614 in a similar manner as the protection circuits 318 and 319 are coupled to the buffer circuit 310 of FIGS. 3A-3C.

Figure 7:
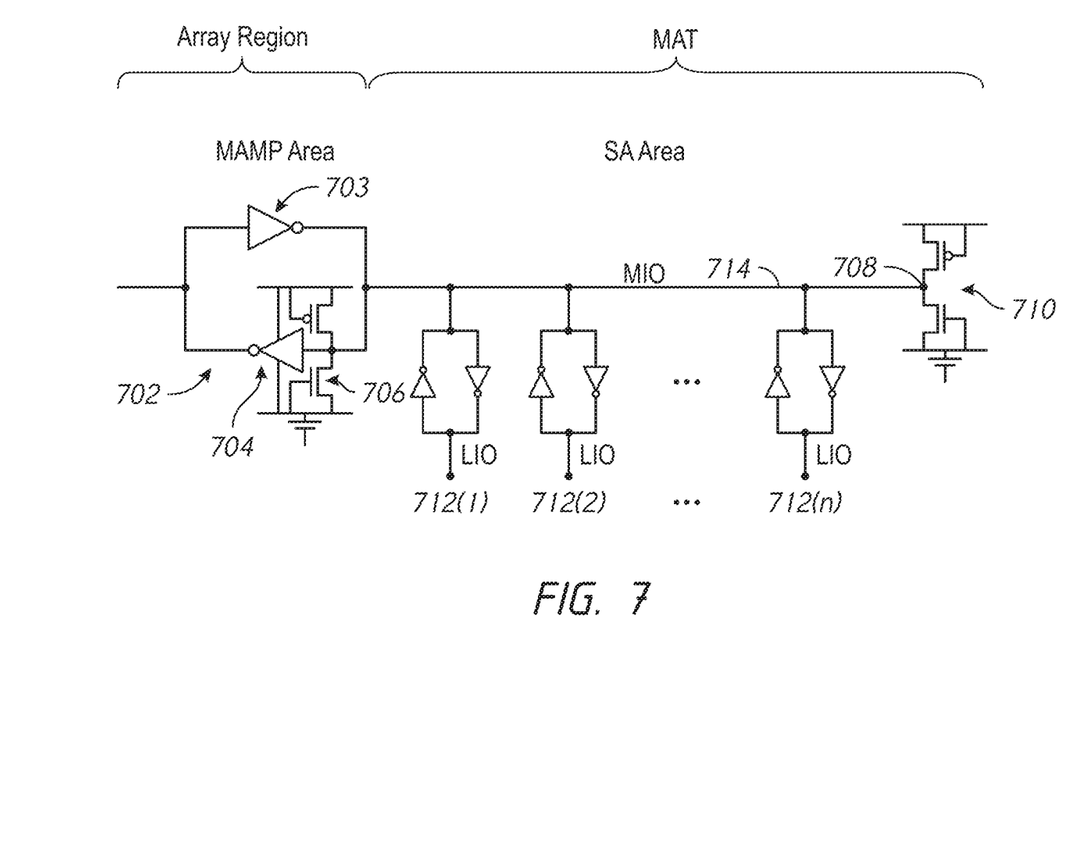

FIG. 7 illustrates an example protection circuit in accordance with some examples disclosed herein. Circuit 702 may be configured to generate a signal in an array region and transmit the signal over a signal line 714 across a MAT and terminate at a terminal 708. Correspondingly, circuit 702 may also be configured to receive a signal from terminal 708 via the signal line 714. Signal line 714 may include a main input/output (IO) bus. In some scenarios, the bus line 714 may be coupled to multiple local I/O bus lines, e.g., 712(1), 712(2) . . . , 712(n), each via a buffer circuit. Similar to FIGS. 5 and 6, circuit 702 may include a bi-directional buffer circuit. For example, circuit 702 may include an inverter 703 and an inverter 704 that are placed in opposite directions and coupled in parallel. An inverter (e.g., 703) may be a driver and the other (e.g., 704) may be a receiver.

With further reference to FIG. 7, similar to FIGS. 5 and 6, one or more protection circuits may be coupled to the buffer circuit. For example, a protection circuit 706 may be coupled to the input of inverter 704 of the buffer circuit, in a similar manner as the protection circuits 318 and 319 are coupled to the buffer circuit 310 of FIGS. 3A-3C. Additionally or alternatively, a protection circuit may also be coupled to the output of inverter 703 to protect the output (e.g., contact plugs) from being damaged due to the accumulated charge from the RDL line. In some scenarios, an additional protection circuit 710 may be coupled to the terminal 708 of the signal line 714 and arranged in a proximity of the terminal region. In a non-limiting example, the terminal region may be disposed in the MAT, and the protection circuit may also be arranged in the MAT. In another non-limiting example, the terminal region may be disposed in a peripheral area outside of MAT, and the protection circuit may also be arranged in that peripheral area outside of MAT.

Various embodiments in FIGS. 1-7 may be implemented in a semiconductor device, such as the cross-sectional views 301 and 302 of a semiconductor device depicted in FIGS. 3B and 3C. For example, in FIGS. 3B and 3C, semiconductor device 300 may include a multi-level wiring structure comprising a first-level wiring layer 304 and a second-level wiring layer 324 below the first-level wiring layer. For example, the first-level wiring layer 304 may include a RDL layer, and the second-level wiring layer 324 may include a top metal layer. An insulating layer may be disposed between the first-level wiring layer 304 and the second-level wiring layer 324.

Additionally, semiconductor device 300 may include one or more bonding pads (not shown) configured to communicate with the outside of the device. In some examples, the RDL layer 304 may be coupled to the bonding pad and configured to extend from the bonding pad to another area of the semiconductor. For example, the RDL layer 304 may extend a central bond pad to a proximity of an edge of the semiconductor device (e.g., the memory device of FIG. 1). Alternatively, the RDL layer 304 may extend an edge bond pad of the semiconductor device to a central peripheral area of the semiconductor. In some examples, semiconductor device 300 may include an additional wiring layer disposed on the same level as the first-level wiring layer. For example, the additional wiring layer may include a bond pad.

In some examples, semiconductor device may also include one or more protection circuits configured to be DC coupled to the second-level wiring layer. For example, in FIG. 5, the second-level wiring layer may include a GBUS line 514. A first protection circuit, e.g., 510 may be disposed in an array region, e.g., in a center area of the semiconductor. A second protection circuit, e.g., 512 may be disposed in an edge region, such as a peripheral region (e.g., outside of MAT). Both the first protection circuit and the second protection circuit may be coupled to the second-level wiring layer. In some examples, a bond pad may also be disposed in the edge region of the semiconductor device (see 132, 112, 122 in FIG. 1B). The first-level wiring layer, e.g., RDL line (304 in FIGS. 3B and 3C) and the second-level wiring layer (e.g., 324 in FIGS. 3B and 3C) may further be capacitively coupled in an intermediate region between the center region and the edge region of the semiconductor device.

As shown in FIG. 5, the semiconductor device may include a driver circuit, e.g. 507 in buffer circuit 506, where the output node of the driver circuit 507 is coupled to the bus line 514. The semiconductor device may also include a receiver circuit, e.g. 511 in buffer circuit 508, where the input node of the receiver circuit is coupled to the bus line 514. The second-level wiring layer may include the bus line, thus the output node of the driver circuit and the input node of the receiver circuit may both be coupled to the second-level wiring layer. In some scenarios, protection circuit 512 may be coupled to the input node of the receiver circuit 511 and located in a proximity (e.g., the input) of the receiver circuit.

Although FIG. 5 shows that a first circuit 506 coupled to a bus line is arranged in an array region whereas a second circuit 508 coupled to the bus line is arranged outside of MAT (e.g., in a peripheral region), it is appreciated that variations may exist. For example, in FIG. 5, circuit 506 may be disposed in a first peripheral region (not shown) and circuit 508 may be disposed in a second peripheral region. Thus, the bus line 514 (e.g., the second-level wiring layer) may span across the first and second peripheral regions, in a memory cell and SA region.

In some examples, such as shown in FIG. 5, an additional driver circuit, e.g., inverter 513 in buffer circuit 508 may be disposed in the same region as the receiver circuit 511 such as the second peripheral region. An additional receiver circuit, e.g., inverter 509 in buffer circuit 506 may be disposed in the same region as the driver circuit 507 such as the first peripheral region. The output node of the additional driver circuit, e.g., inverter 513 and the input node of the additional receiver circuit 509, may each be coupled to the bus line 514, e.g., in the second level wiring layer. Additionally or alternatively, an additional protection circuit 510, may be located in the first peripheral region, whereas the protection circuit 512 is located in the second peripheral region. The additional protection circuit 510 may be coupled to the input node of the second receiver 509, and may also be coupled to the bus line 514, such as the second-level wiring layer.

In other variations, such as shown in FIG. 7, a driver circuit, e.g., 703 may be coupled to an end of a bus line, e.g., 714 and a protection circuit, e.g., 710 may be coupled to the other end of the bus line 714. In some examples, the bus line 714 may include a memory IO bus. Bus line 714 may be included in the second-level wiring layer. Additionally and/or alternatively, the protection circuit (e.g., 218 in FIG. 2, 316 in FIG. 3A, 410 in FIGS. 4, 510 and 512 in FIGS. 5, 609, 610, 616 and 618 in FIG. 6, and 706 and 710 in FIG. 7) may include a transistor such as a P-type and/or N-type transistor, which is configured to discharge a charge to protect a gate insulating layer (or contact plugs) of the circuit (e.g., a buffer circuit). This charge that may be damaging the gate insulating layer is considerably smaller than that accumulated in the circuit (e.g., CDM). As such, the size of the transistors) in the protection circuit may be kept small, resulting in very little overhead in the memory circuit.

Various embodiments in FIGS. 1-7 described herein provide advantages over existing apparatuses, in which RDL line is used in a semiconductor device. When a protection circuit is DC coupled to an input or output of a receiver/driver, the gate insulating film of the input of the receiver circuit or the contact plug of the output of the driver circuit is protected from a charge accumulated on the top metal layer caused by the RDL line. As such, the amount of noise in the semiconductor device is reduced.

From the foregoing it will be appreciated that, although specific embodiments of the disclosure have been described herein for purposes of illustration, various modifications or combinations of various features may be made without deviating from the spirit and scope of the disclosure. For example, the various circuits disclosed herein, such as the protection circuit 218 in FIG. 2, 316 in FIG. 3A, 410 in FIGS. 4, 510 and 512 in FIGS. 5, 609, 610, 616 and 618 in FIG. 6, and 706 and 710 in FIG. 7 may be stand-alone or part of a logic circuit in the memory device. Accordingly, the disclosure is not limited except as by the appended claims.

We claim:

1. A device comprising:
    a multi-level wiring structure comprising a first-level wiring layer, a second-level wiring layer below the first-level wiring layer, an additional first-level wiring layer on the same level as the first-level wiring layer, and an insulating film between the first-level wiring layer and the second-level wiring layer;
    a bonding pad;
    a first wiring formed as the first-level wiring layer, the first wiring extending from the bonding pad, wherein the bonding pad is formed as the additional first-level wiring layer;
    a second wiring formed as the second-level wiring layer, the second wiring overlapping, at least in part, with the first wiring through the insulating film to be capacitively coupled to the first wiring;
    a circuit including a transistor including a gate coupled to the second wiring and further including a gate insulating layer disposed between the gate and a substrate; and
    a protection element configured to be DC coupled to the second wiring.

2. The device of claim 1, further comprising an additional protection element located in a center region of the device, the additional protection element configured to be DC coupled to the first wiring;
    wherein the bonding pad is located in an edge region of the device and the first wiring is connected between the bonding pad and the additional protection element; and
    wherein the second wiring is capacitively coupled to the first wiring in an intermediate region between the center region and the edge region of the device.

3. The device of claim 1, wherein the circuit comprises a driver circuit having an output node coupled to the second wiring and further comprises a receiver circuit having an input node coupled to the second wiring;
    Wherein the protection element is located at a side of the receiver circuit.

4. The device of claim 1, wherein the circuit comprises a driver circuit coupled to a first end of the second wiring;
    wherein the protection element is coupled to a second end of the second wiring.

5. A device comprising:
    a multi-level wiring structure comprising a first-level wiring layer, a second-level wiring layer below the first-level wiring layer, and an insulating film between the first-level wiring layer and the second-level wiring layer;
    a bonding pad;
    a first wiring formed as the first-level wiring layer, the first wiring extending from the bonding pad;
    a second wiring formed as the second-level wiring layer, the second wiring overlapping, at least in part, with the first wiring through the insulating film to be capacitively coupled to the first wiring, wherein the second wiring elongates in a memory cell array region between first and second peripheral regions;
    a driver circuit arranged in the first peripheral region and having an output node coupled to the second wiring;
    a receiver circuit arranged in the second peripheral region and having an input node coupled to the second wiring; and
    a protection element located in the second peripheral region and at a side of the receiver circuit and configured to be DC coupled to the second wiring.

6. A device comprising:
    a multi-level wiring structure comprising a first-level wiring layer, a second-level wiring layer below the first-level wiring layer, and an insulating film between the first-level wiring layer and the second-level wiring layer;
    a bonding pad;
    a first wiring formed as the first-level wiring layer, the first wiring extending from the bonding pad;
    a second wiring formed as the second-level wiring layer, the second wiring overlapping, at least in part, with the first wiring through the insulating film to be capacitively coupled to the first wiring;
    a protection element configured to be DC coupled to the second wiring;

a first driver circuit arranged in a first peripheral region, the first driver circuit comprising an output node coupled to the second wiring;

a first receiver circuit arranged in a second peripheral region, the first receiver circuit comprising an input node coupled to the second wiring;

a second driver circuit arranged in the second peripheral region, the second driver circuit comprising an output node coupled to the second wiring;

a second receiver circuit arranged in the first peripheral region, the second receiver circuit comprising an input node coupled to the second wiring; and an additional protection element configured to be DC coupled to the second wiring, the additional protection element being located in the first peripheral region;

wherein the second wiring elongates in a memory array region between the first and second peripheral regions; and wherein the protection element is located in the second peripheral region.

7. A device comprising:

a redistribution layer (RDL) coupled to one or more bond pads;

a first circuit having an input node;

a signal line extending from a first area of the device to a second area of the device that is different from the first area, the signal line is further capacitively coupled to the RDL, and also coupled to the input node of the first circuit in the first area; and a protection circuit disposed in the first area and coupled to the input node of the first circuit, wherein the protection circuit is configured to discharge noise capacitively coupled onto the signal line from the RDL layer.

8. The device of claim 7, wherein the first area and the second area each includes one of a memory cell and sense amplifier area, an array region and a peripheral area.

9. The device of claim 7, wherein the signal line may include a control line, an address line, a data bus and/or a combination thereof.

10. The device of claim 7, wherein the first circuit includes a receiver buffer circuit and the input node of the first circuit includes a transistor gate.

11. The device of claim 10, wherein the protection circuit includes a first transistor and a second transistor connected coupled at a common source/drain, wherein the common source/drain is coupled to the input node of the buffer circuit.

12. The device of claim 7, wherein the first circuit includes a driver buffer circuit comprising an input node and a receiver buffer circuit comprising an output node, the driver buffer circuit and the receiver buffer circuit are coupled in parallel, wherein an input node of the receiver buffer circuit and an output node of the driver buffer circuit are coupled together and are further coupled to the signal line.

13. The device of claim 12, wherein the protection circuit is coupled to the input node of the receiver buffer circuit.

14. The device of claim 13 further comprising an additional protection circuit coupled to the output node of the driver buffer circuit.

15. The device of claim 7 further comprising a second circuit coupled to the signal line at the second area of the device, and an additional protection circuit coupled to the second circuit, wherein the additional protection circuit is configured to discharge noise capacitively coupled onto the signal line from the RDL layer.

16. The device of claim 15, wherein:

the first circuit includes a driver buffer circuit comprising an input node and a receiver buffer circuit comprising an output node, the driver buffer circuit and the receiver buffer circuit of the first circuit are coupled in parallel so that an input node of the receiver buffer circuit and an output node of the driver buffer circuit are coupled together and are further coupled to the signal line; and the second circuit includes a driver buffer circuit comprising an input node and a receiver buffer circuit comprising an output node, the driver buffer circuit and the receiver buffer circuit of the second circuit are coupled in parallel so that an input node of the receiver buffer circuit and an output node of the driver buffer circuit are coupled together and are further coupled to the signal line.

17. The device of claim 16, wherein:

the protection circuit is coupled to the input node of the receiver buffer circuit of the first circuit; and the additional protection circuit is coupled to the input node of the receiver buffer of the second circuit.

18. The device of claim 17 further comprising:

a third protection circuit coupled to the output node of the driver buffer circuit of the first circuit, wherein the third protection circuit is configured to discharge noise capacitively coupled onto the signal line from the RIM, layer; and a fourth protection circuit coupled to the output node of the driver buffer circuit of the second circuit, wherein the fourth protection circuit is configured to discharge noise capacitively coupled onto the signal line from the RDL layer.

19. The device of claim 7 further comprising an additional protection circuit coupled to a terminal of the signal line in the second area, wherein the additional protection circuit is configured to discharge noise capacitively coupled onto the signal line from the RDL layer.

* * * * *